United States Patent
Aggarwal et al.

(10) Patent No.: US 6,194,754 B1
(45) Date of Patent: Feb. 27, 2001

(54) AMORPHOUS BARRIER LAYER IN A FERROELECTRIC MEMORY CELL

(75) Inventors: Sanjeev Aggarwal; Ramamoorthy Ramesh, both of Silver Springs, MD (US)

(73) Assignees: Telcordia Technologies, Inc., Morristown, NJ (US); University of Maryland at College Park, College Park, MD (US)

(*) Notice: Subject to any disclaimer, the term of this patent is extended or adjusted under 35 U.S.C. 154(b) by 0 days.

(21) Appl. No.: 09/263,800

(22) Filed: Mar. 5, 1999

(51) Int. Cl.[7] .................. H01L 29/76; H01L 29/92
(52) U.S. Cl. .................. 257/295; 257/751; 438/3; 438/240
(58) Field of Search .................. 257/295, 751, 257/766; 438/3, 2, 240, 104

(56) References Cited

U.S. PATENT DOCUMENTS

| | | | |
|---|---|---|---|
| 5,077,270 | 12/1991 | Takeda et al. | 505/1 |
| 5,248,564 * | 9/1993 | Ramesh | 428/688 |
| 5,270,298 | 12/1993 | Ramesh | 505/1 |
| 5,293,510 * | 3/1994 | Takenaka | 257/295 |
| 5,406,445 * | 4/1995 | Fujii et al. | 361/605 |
| 5,479,317 * | 12/1995 | Ramesh | 361/321.5 |
| 5,519,235 * | 5/1996 | Ramesh | 257/295 |
| 5,665,628 * | 9/1997 | Summerfelt | 438/3 |
| 5,753,945 * | 5/1998 | Chivukula et. al. | 257/295 |
| 5,777,356 * | 7/1998 | Dhote et al. | 257/295 |
| 5,798,903 | 8/1998 | Dhote et al. | 361/321.4 |
| 5,838,035 * | 11/1998 | Ramesh | 257/295 |
| 6,063,639 * | 5/2000 | Kim et al. | 438/3 |
| 6,115,281 * | 9/2000 | Aggarwal et al. | 365/145 |

OTHER PUBLICATIONS

Liu et al., "Ordered Intermetallics," *ASM Handbook*, vol. 2, *Properties and Selection: Nonferrous Alloys and Special–Purpose Materials* (ASM International, 1992) pp. 913–942.

Arcot et al., "Intermetallic formation in copper/magnesium thin films–kinetics, nucleation and growth, and effect of interfacial oxygen,", *Journal of Applied Physics*, vol. 76. No. 9. Nov., 1994, pp. 5161–5170.

Greer, "Amorphous Phases," *Intermetallic Compounds: Principles and Practice*, vol. 1. Chapter 31, eds. Westbrook et al. (Wiley, 1995), pp. 731–754.

de Reus, "Diffusion Barriers," *Intermetallic Compounds: Principles and Practice*. Chapter 29, eds. Westbrook et al. (Wiley, 1995), vol. 2, pp. 603–635.

* cited by examiner

Primary Examiner—Mary Wilczewski
(74) Attorney, Agent, or Firm—David A. Hey

(57) ABSTRACT

A ferroelectric cell, particularly one integrated on a silicon substrate, comprising an amorphous barrier layer interposed between the ferroelectric stack and the silicon. Preferably, the ferroelectric stack includes conductive metal oxide electrodes sandwiching the ferroelectric layer. The metal oxide may act as a templating layer to crystallographically orient the ferroelectric layer. Alternatively, the electrodes and ferroelectric layer may be polycrystalline. The amorphous barrier layer may be composed of an intermetallic alloy, such as $Ti_3Al$, a metal-metalloid, such as Pd—Si, a combination of early and later transition metals, such as Ti—Ni, and other related compound metal systems, such as (Ti, Zr)—Be, that form amorphous metals.

35 Claims, 5 Drawing Sheets

AMORPHOUS BARRIER LAYER IN A FERROELECTRIC MEMORY CELL

FIELD OF THE INVENTION

The invention generally relates to ferroelectric structures integrated onto substrates such as silicon. In particular, the invention relates to the fabrication process of producing a ferroelectric structure on a silicon or polysilicon surface.

BACKGROUND ART

Considerable interest exists in fabricating integrated circuit (IC) memories which are non-volatile, that is, ones that continue to store data after the IC chip has been powered down. One type that is reaching the market is a ferroelectric memory, in particular, a ferroelectric random access memory (FRAM). In an FRAM, the gap between the electrodes of a capacitor is filled with a spontaneously polarizable ferroelectric material which can be electrically poled into either of two stable states. The commercial activity to date has involved polycrystalline ferroelectric materials in ferroelectric cells integrated with silicon circuitry. Examples of the ferroelectric materials include lead zirconium titanate (PZT), lead lanthanum zirconium titanate (PLZT), lead niobium zirconium titanate (PNZT). Despite intensive developmental efforts, these polycrystalline ferroelectric IC memories suffer from low yield in manufacture mostly due to the absence of a good barrier layer between the oxygen-rich ferroelectric material and the oxygen-sensitive silicon.

In an alternative approach under development, the ferroelectric material is grown in a crystallographically oriented phase. It is believed that under the proper conditions the ferroelectric grows in a columnar multicrystalline structure with the <001> axis of the layered perovskite crystal structure of typical ferroelectrics being preferentially oriented normal to the ferroelectric film. Thereby, c-axis oriented columnar crystallites are formed with random orientation within the plane of the film.

In U.S. Pat. No. 5,777,356, incorporated herein by reference in its entirety, Dhote and Ramesh have disclosed an advantageous ferroelectric cell incorporating an intermetallic barrier layer. Aggarwal, Dhote and Ramesh have disclosed an improved annealing process for fabricating this structure in U.S. patent application, Ser. No. 08/871,057, filed Jun. 9, 1997. A structure envisioned in these two patent applications is illustrated in the cross-sectional view of FIG. 1. An illustrated ferroelectric random access memory (FRAM) cell 20, of which many are formed in the IC memory, is formed on a <001>-oriented crystalline silicon substrate 22 and includes both a ferroelectric capacitor and a transistor. A metal-oxide-semiconductor (MOS) transistor is created by forming source and drain wells 24, 26 having a conductivity type opposite to that of the substrate 22. The intervening gate region is overlaid with a gate structure 28 including a lower gate oxide and an upper metal gate line, for example of aluminum, to control the gate.

A first inter-level dielectric layer 30 is deposited over the substrate and the transistor structure. A through hole 32 is etched through the first inter-level dielectric layer 30 in the area over the source well 24, and polysilicon is filled into the through hole 32 to form a polysilicon contact plug to the transistor source. A metal source line 34 is photolithographically delineated on top of the first inter-level dielectric layer 30 and electrically contacts the polysilicon plug 32.

A second inter-level dielectric layer 36 is then deposited over the first inter-level dielectric layer 30. Another through hole 38 is etched through both the first and second inter-level dielectric layers 30, 36 over the area of the drain well 26, and polysilicon is filled into the second through hole 38 to form a contact plug to the transistor drain 26.

A lower ferroelectric stack is then deposited and defined over the polysilicon plug 38. It includes a polysilicon layer 40 to promote electrical contact to the polysilicon plug 38, a titanium nitride (TiN) layer 42 acting as a first conductive barrier between the underlying polysilicon and the oxidizing ferroelectric layer and its oxide electrodes, an intermetallic layer 44 acting as the primary barrier, and a lower metal-oxide electrode 46. The TiN layer 42 has been found to not be essential.

Growth of the metal-oxide electrodes 46, 52 and the ferroelectric layer 50 is performed at temperatures in the range of 500° to 650° C., the highest temperatures achieved in the processing after the deposition of the intermetallic layer 44.

The intermetallic layer 44 is novel to the cited earlier patent. It may have a composition of $Ti_3Al$, among other possibilities to be discussed later. In brief, an intermetallic is an alloy of at least two metals, one of which is refractory, and the metals are conventionally combined in stoichiometric or near stoichiometric ratios. Conventionally, it has been understood that there results a metal with long-range atomic order, that is, a metal that is at least polycrystalline. Liu et al. provide a good introduction to intermetallics, at least the intermetallics having long-range order as used for mechanical components, in "Ordered Intermetallics," *ASM Handbook, vol. 2, Properties and Selection: Nonferrous Alloys and Special-Purpose Materials* (ASM International, 1992) pp. 913–942. The intermetallic layer 44 acts as an electrically conductive barrier to prevent the oxygen needed to fabricate the perovskite layers 46, 50, 52 from migrating downwardly while the perovskite are being deposited in an oxygen-rich environment at the relatively high temperatures of 500 to 650° C.

The lower metal-oxide electrode may have a composition of lanthanum strontium cobaltite (LSCO), and in particular a composition of approximately $La_{1-x}Sr_xCoO_3$, where $0.15 \geq x \geq 0.85$. A composition of x=0.5 is used in the examples. It is now well known that LSCO forms an acceptable electrical contact and further under the proper processing conditions promotes highly oriented growth of perovskite ferroelectric materials grown over it. That is, it acts as a templating layer. Alternative conductive metal oxides include among others strontium ruthenate ($SrRuO_3$) and strontium vanadate ($SrVO_3$). Several variations on the structure of the lower ferroelectric stack are possible. Neither the polysilicon layer 40 nor the TiN layer 42 is considered crucial, and either or both may be dispensed with.

A Z-shaped field-oxide layer 48 is formed around the sides of the lower ferroelectric stack and extends over its rim and laterally outwards from its bottom but leaves a central aperture for the after deposited upper ferroelectric stack.

The upper ferroelectric stack is then deposited and defined to fill the aperture of the field oxide layer 48 but not to extend beyond the end of its foot. The upper ferroelectric stack includes the ferroelectric layer 50, for example of PNZT, the upper metal-oxide electrode layer 52, for example of LSCO, and a platinum layer 54.

A third inter-layer dielectric layer 56 is deposited around the upper and lower ferroelectric stacks. A via hole 60 is etched down to the platinum layer 54, and Ti/W is filled into the hole to form a via 60 contacting the platinum layer 54. An aluminum layer is deposited and delineated to form an interconnect line 62 connected to the via 60.

Variations on this structure include replacement of the polysilicon with tungsten (W) or with a layered structure of TiN/W or of polysilicon/TiN/W.

Prototype ferroelectric capacitor stacks have been grown following the vertical stack structure shown in FIG. 1. Both the LSCO electrodes 46, 52 and the ferroelectric layer 50 have been shown to exhibit highly crystalline <001> orientation when grown under the proper conditions. The ferroelectric stacks have been measured to have polarization, fatigue, and retention properties superior to those available from polycrystalline ferroelectric cells.

A very important characteristic of ferroelectric cells, if they are to be commercialized, is their aging or fatiguing as they are repetitively cycled between their two states or are read. Fatigue is generally believed to be associated with the diffusion of oxygen along grain boundaries. In the crystallographically oriented <001> ferroelectric stacks, the oxygen diffuses at a much lower rate along the columnar grain boundaries in the LSCO electrodes and the ferroelectric layer. The intermetallic barrier of the earlier patent substantially reduces the source of the diffusing oxygen while the rapid thermal annealing of the later patent application mentioned above is believed to enlarge the crystallite size, thus reducing the intergranular boundaries and minimizing the diffusion routes.

The later patent application emphasizes the annealing of the structure, presumably to enlarge the average crystallite size. Any annealing increases the crystallite size, and single crystalline layers, especially of the ferroelectric layer, would provide the best devices. However, annealing of the ferroelectric stack requires that the already fabricated silicon circuits of FIG. 1 also be subjected to the annealing. Thermal budgets for advanced silicon integrated circuits are tight so that only a limited amount of ferroelectric annealing is available. Improved crystallinity of the ferroelectric stack is thus desired by methods which do not require a large thermal budget.

The present invention requires a more complete understanding of the functions and structure of the ferroelectric stack and underlying layers presented in FIG. 1. The intermetallic barrier or barrier of other material performs a number of functions required for a dependable ferroelectric memory cell. In the desired design of FIG. 1, the polysilicon plug 38 and the overlying polysilicon layer 40, if there is one, are heavily doped to effectively act as a metallic conductor. However, polysilicon is still a semiconductor subject to depletion of its carriers by defects, and surface oxidation of the polysilicon produces the robust insulating silicon dioxide, which would destroy the electrical contact.

We observe that the barrier must perform a number of functions. It must prevent the diffusion of oxygen into the polysilicon plug 38 or overlying polysilicon layer 40 during the high-temperature, oxygen-rich deposition and possible annealing of the overlying ferroelectric stack. It must prevent the diffusion of silicon from the polysilicon into the ferroelectric stack and must prevent the diffusion of lead and other metal ions from the ferroelectric stack into the polysilicon. The material of the barrier should not react with silicon and should form a low-resistance ohmic contact to the polysilicon. It itself should not be severely oxidized during the ferroelectric processing. Tungsten plugs suffer some of the same problems as polysilicon ones since tungsten oxidizes to non-metallic $WO_3$.

In the past, titanium nitride (TiN) has been the favored barrier material, especially in view of its widespread use in the semiconductor industry. However, TiN oxidizes at about 500° C. whereas the optimum temperature for processing lead-based ferroelectrics is about 600° C., and the temperature for processing layered perovskites usable as self-aligning templating layers may be as high as 800° C.

Platinum (Pt) has in the past been favored as a contact in ferroelectric cells since it does not oxidize at these elevated temperature, but platinum performs as an uncertain barrier against the diffusion of oxygen. However, any use of platinum is disadvantageous because of the difficulty of patterning it by an etching method.

Accordingly, it is desired to provide a better diffusion barrier, both in the crystallographically oriented ferroelectric stacks but also in the more conventional ferroelectric stacks utilizing a polycrystalline ferroelectric.

SUMMARY OF THE INVENTION

A ferroelectric memory cell or other perovskite cell in which the perovskite layers are grown on a layer with intermetallic composition and having a substantially amorphous crystallography. The preferred embodiment of a ferroelectric memory cell is fabricated on a silicon substrate incorporating some support transistors. The amorphous intermetallic layer is deposited over the silicon or polysilicon or over an intermediate barrier of, for example, titanium nitride. A lower electrode, preferably of a conductive metal oxide, is deposited over the intermetallic, and it may self-align to a preferred crystallographic orientation. The ferroelectric or other perovskite layer is then deposited onto the templating lower oxide electrode and forms with the preferred crystallographic orientation, if any. Other electrodes may be applied above the perovskite layer as required.

A ferroelectric memory cell or other perovskite cell can be grown without the templating lower electrode but nonetheless utilizing an amorphous intermetallic barrier.

The barrier may be an intermetallic alloy as previously understood, but it may alternatively be composed of other materials manifesting similar qualities of short range order in their crystal structure but no long range order.

DETAILED DESCRIPTION OF THE PREFERRED EMBODIMENTS

Figure 1:
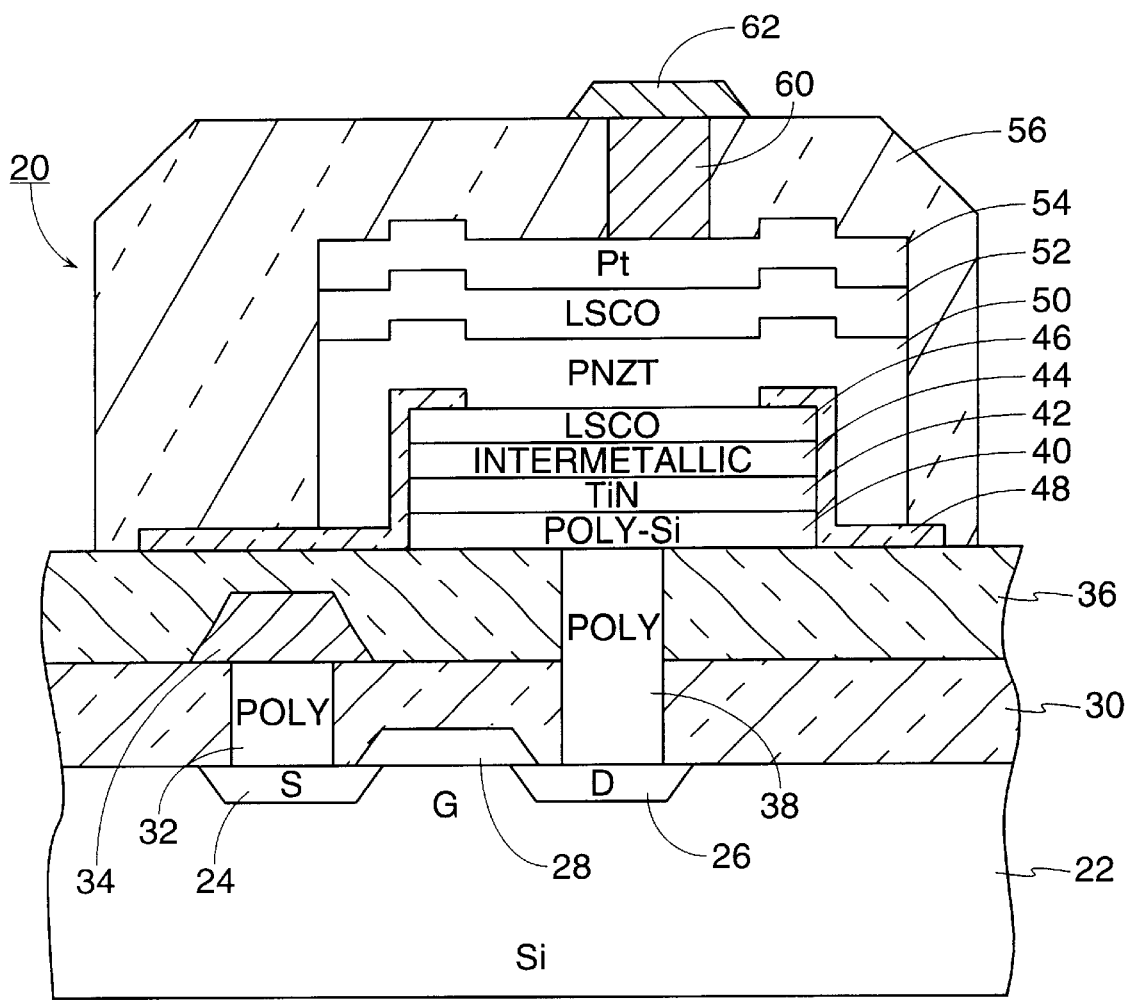
FIG. 1 is a cross-sectional view of a ferroelectric memory cell integrated on a silicon substrate.

The previous work on intermetallic barriers was based on the thermodynamic stability of specific stoichiometric compositions of intermetallic alloys, such as $Ti_3Al$, $Ni_3Al$, etc. We believe that barriers of intermetallic materials and related metal alloys benefit from a nearly amorphous crystalline structure and that many advantageous intermetallic compositions show a strong tendency under the proper processing conditions to form in an amorphous state.

Long-range order in metals such as expected in the intermetallic alloys described in U.S. Pat. No. 5,777,356 is akin to crystallinity. It is conventionally believed that typical intermetallic layers, especially in the structure of FIG. 1, grow as a polycrystalline materials with moderately large crystallite sizes, which may be increased by high deposition temperatures or annealing after deposition. However, the polycrystallites are randomly oriented and are separated by grain boundaries. Grain boundaries may provide paths for relatively rapid diffusion of oxygen and other deleterious atoms from one side of the barrier to the other.

There are two methods of avoiding the problems associated with grain boundaries in polycrystalline barriers, especially those underlying crystallographic templating or buffer/barrier layers. First, the barrier may be grown as a single crystalline structure. We have grown a ferroelectric memory structure as summarized in TABLE 1.

TABLE 1

| LSCO |
| PZT |
| LSCO |
| Pt |
| TiN |
| Poly-Si |
| Si |

The polycrystalline form of polysilicon causes all the layers above it to also form as polycrystalline layers (no measures were taken to enhance the self-alignment of the LSCO). We also grew a structure that dispenses with the polysilicon layer so the TiN is grown directly on the (001)-oriented silicon. This approach produces a single crystalline microstructure that grows epitaxially on the silicon, including the TiN and Pt layers. We found that the single crystalline stacks are much more robust against oxygen diffusion and prevent the oxidation of TiN to $TiO_2$.

Although our previous work has emphasized the approach of single crystalline layers, realistic structures do not provide for growth of perovskites directly on crystalline silicon. Crystallographic templating is helpful for reestablishing crystallographic orientation, but it seems nearly impossible to form single crystals having sufficient size to extend over a large number of ferroelectric cells. Even columnar crystals having a lateral size of a ferroelectric stack are difficult to obtain, and even then statistically a large number of stacks will have at least one grain boundary.

The second approach for avoiding grain boundaries in the barrier involves amorphous barrier layers, that is, ones with no long-range order. Many amorphous materials manifest a short-range order over a dimension of one to three atomic bond lengths, but, much beyond that dimension, the geometric arrangement of the atoms becomes random with respect to each other. Importantly, however, amorphous materials do not in general have grain boundaries across which crystallographic ordering quickly changes. Grain boundaries produce many defects and dangling bonds that can promote diffusion along the boundaries. We believe amorphous barrier layers provide a more feasible commercial process avoiding the intergrain problem since there are no grain boundaries. While there may be some dangling bonds and defects in the amorphous material, they are distributed as isolated defects and are not concentrated at the grain boundaries, and thus do not present a continuous diffusion path.

An amorphous material is distinguished from a polycrystalline material on several grounds. The crystalline order of an amorphous material may extend over a few atomic bonding lengths (lattice constants), two to five being typical values, that is, 1 to 3 nm, while the crystalline order of polycrystallites extends typically over the size of crystallites, typically in the range of 50 nm to 1 to 10 um or so. X-ray or neutron diffraction can be used to quantify the short-range order of the material. A polycrystalline material has fairly well defined and continuous grain boundaries while an amorphous material has virtually no continuous grain boundaries. Scanning electron micrographs (SEMs) of polycrystalline material show distinctive ragged grain boundaries while those of amorphous material show very little texture.

The use of a metal alloy layer as a diffusion barrier has been described by de Reus in "Diffusion Barriers," *Intermetallic Compounds: Principles and Practice*, Chapter 29, eds. Westbrook et al. (Wiley, 1995), vol. 2, pp. 603–635, and he describes amorphous barriers, ibid., pp. 605, 609, and 618–620. However, de Reus addresses only the diffusion of metals through the barrier, not of oxygen, as occurs in ferroelectric stacks. Indeed, he promotes stuffing oxygen into polycrystalline intermetallic barriers to reduce diffusion. Takeda et al. in U.S. Pat. No. 5,077,270 suggests placing an additional amorphous layer between a polycrystalline substrate and a templating layer composed of a material from a class including LSCO.

We have established DC sputtering conditions that produce a satisfactorily amorphous intermetallic layer. The sputtering target having a diameter of 75 mm is composed of the desired intermetallic composition, e.g., $Ti_3Al$ and faces the interior of a sputtering chamber pumped to a base pressure of $10^{-6}$ Torr. However, argon working gas is metered into the chamber to a pressure of 1 to 9 mTorr. When a sufficiently large negative DC voltage is applied to the target with respect to the chamber wall, the argon discharges to a plasma and the argon ions strike the target with sufficient energy to sputter intermetallic particles or constituent atoms from the target, which then strike the substrate to cover it with a layer of the intermetallic material. Generally, the larger the power applied to the target, the denser the plasma and the more target material is sputtered.

When $Ti_3Al$ is sputter deposited on a substrate of silicon covered with a layer of polysilicon, the intermetallic crystallinity as measured by X-ray diffraction shows no dependence upon the argon pressure or the length of deposition. However, crystallinity does depend strongly upon the power applied to the sputtering target. A peak at about 39° is identified with the (002) reflection from the intermetallic crystal structure. At 100 W of DC sputtering power (2.3W/$cm^2$ on the target), no such peak is visible in the noise of about 20 cps (counts per second from the X-ray detector). At 400W (9.2W/$cm^2$), the peak has a level of about 50cps. At 600W, the peak level is about 5600 cps. That is, the amorphous phase is dominant when the material is produced with a sputtering power of less than 400W. By 600W, the material is strongly crystalline, presumably polycrystalline. Similar though less dramatic results are observed for $Ti_3Al$ doped with Nb—Mo—V.

It is also possible to control the crystallinity of films deposited by either sputtering or pulsed laser deposition by controlling the temperature of the substrate being coated. Higher temperatures promote crystalline growth, while very low temperatures, generally significantly below the bulk glass transition temperature, promote amorphous growth.

It is further possible to control the crystallinity of intermetallic alloys by ex situ annealing, in particular to convert an amorphous sample to the more thermodynamically stable crystalline phase. In one set of experiments, nickel titanium (NiTi) films were deposited amorphous so they exhibit only a very broad and low peak in the 40 to 45° X-ray diffraction range. However, when they are annealed at 450° C. and 500° C. respectively for 1 hour, two sharp peaks develop and enlarge at about 42.7° and 43.5°, angles that are identified respectively with the (110) cubic reflection and the (002) monoclinic reflection from nickel titanium crystals. Crystalline nickel titanium oxidizes at 500° C., which is near or below the growth temperature for the ferroelectric stack. Different deposition techniques could lower the growth temperatures to 500° C. or lower and avoid the crystalline oxidation. However, amorphous NiTi films do not react at these temperatures and show excellent oxidation resistance.

Greer provides a general guide to forming intermetallics in the amorphous state in "Amorphous Phases," *Intermetallic Compounds: Principles and Practice*, vol. 1, Chapter 31, eds. Westbrook et al. (Wiley, 1995), pp. 731–754. However, his description is mostly directed to bulk samples, and wider ranges of glass forming compositions are available with thin films.

Based upon the now perceived need for an amorphous barrier layer in a ferroelectric memory cell integrated on a silicon integrated circuit, one preferred structure is illustrated in TABLE 2.

TABLE 2

| |
| --- |
| Intermetallic |
| Conductive |
| Metal Oxide |
| Ferroelectric |
| Conductive |
| Metal Oxide |
| Amorphous |
| Intermetallic |
| Poly-Si |
| Si |

Figure 2:
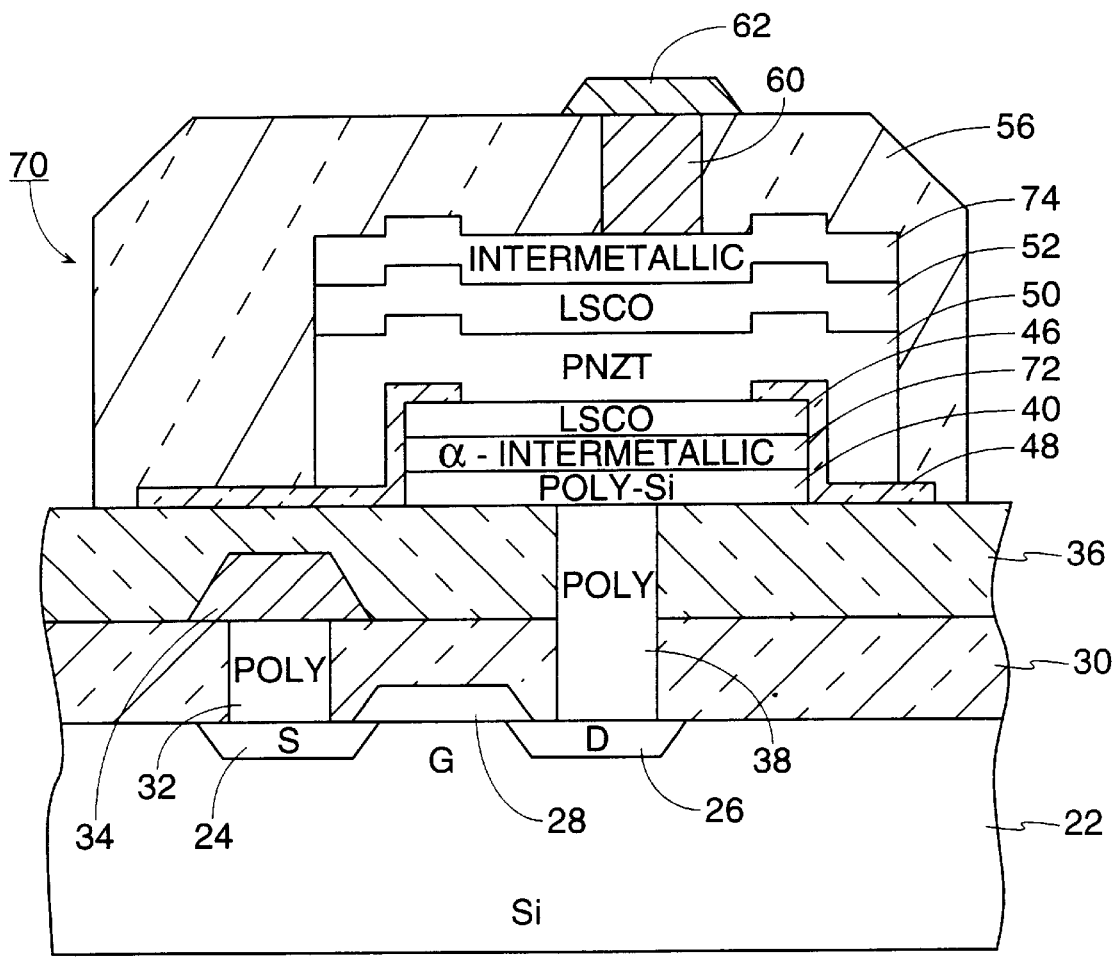
FIG. 2 is a cross-sectional view of an embodiment of a ferroelectric memory cell of the invention.

An example of an integrated f electric memory cell 70 of the invention is illustrated in the cross-sectional view of FIG. 2. It differs importantly from cell 20 of FIG. 1 in having an amorphous intermetallic lower barrier layer 72, an important aspect of the present invention, and an intermetallic upper barrier or contact layer 74. We disclosed the inclusion of an upper intermetallic barrier in U.S. patent application, Ser. No. 08/871,057, but we disclosed an additional utility for it in U.S. patent application, Ser. No. 09/151,903, filed Sep. 11, 1998, now U.S Pat. No. 6,115,281 specifically a non-catalyzing barrier against the hydrogen-based forming-gas anneal required for the underlying silicon circuits. Interestingly in this case, a crystalline intermetallic upper barrier is superior to an amorphous one.

The bottom amorphous intermetallic barrier 72 provides the barrier between the ferroelectric stack fabricated at high temperatures in an oxygen-rich ambient and the oxygen-sensitive silicon. In the case that the ferroelectric stack is grown to be crystallographically oriented, for example, by the use of LSCO as the conductive metal oxide for the bottom electrode, the amorphous intermetallic barrier promotes the crystallographic self-alignment of the LSCO.

It should be emphasized that the structure of TABLE 2 is not limited to strongly crystalline materials or processes producing crystallographically oriented materials. A wide range of ferroelectric materials are available. Some of the currently popular materials are summarized in TABLE 3 although other ferroelectric materials may be substituted.

TABLE 3

| |
| --- |
| Ferroelectric Layer |
| $Pb_{1-x}La_x(Zr, Ti, Nb)O_3$ |
| $Ba_{1-x}Sr_xTiO_3$ |
| Bi—Sr—(Ta, Nb)—O |

The metal oxide electrodes may be formed either of the perovskite materials known to provide strong templating or of polycrystalline materials, such as the rutiles $RuO_2$ and $IrO_2$. Alternatively, the perovskites can be grown under conditions favoring non-crystalline growth. Examples of the metal-oxide electrode materials are presented in TABLE 4, but other materials are possible.

TABLE 4

| |
| --- |
| Oxide Electrodes |
| La—Sr—Cu—O |
| Sr—Ca—Ru—O |
| La—Sr—V—O |
| La—Sr—Cr—O |
| La—Sr—Cu—O |
| Y—Ba—Cu—O |
| Bi—Sr—Ca—Cu—O |
| Nd—O |
| Nb—O |
| Sm—O |
| La—O |
| V—O |
| Ru—O |
| Ir—O |

The material of the barrier layers may be more freely chosen than was appreciated previously. A few examples of barrier materials are presented in TABLE 5.

TABLE 5

| |
| --- |
| Barrier Layers |
| TiN |
| Ti—W—N |
| Ta—Si—N |
| Ni—Ti |
| Ni—Al |
| Co—Al |
| Ti—Al |

Titanium nitride is a well known barrier layer, both for ferroelectrics and for silicon circuits. Titanium tungsten nitride and tantalum silicon nitride are high-performance modifications of TiN. We believe that the advantages learned from the amorphous intermetallics, which remain the preferred barrier materials, can be advantageously applied to the nitrides.

The bottom four materials listed in TABLE 5 include the preferred constituents of intermetallic compositions. However, other intermetallic materials are available, as has been described in our previously mentioned patent documents, incorporated herein by reference. The preferred general family of intermetallic alloys, as defined in U.S. Pat. No. 5,77,356, are those having a stoichiometric composition, to within 5 atomic % of AB, $AB_2$, $A_2B$, $AB_3$, and $A_3B$, where A is selected from the family consisting of Fe, Cr, Co, Ni, Mn, and Mo, and B is selected from the family consisting of Al, Ti, Cr, Si, Ru, Re. There are also AA' and BB' members, the most important of which is nearly stoichiometric titanium-aluminum, e.g., $Ti_3Al$. In fact, titanium tends to form good stoichiometric barrier materials with many of the above listed B elements, excluding of course Ti. These materials can additionally be doped with metals such as Nb, Mo, and V, as is well known. However, Greer, ibid., provides a more general description of amorphous intermetallics not limited by these definitions, particularly the stoichiometric limitation.

A series of samples were fabricated to test the interface between the intermetallic barrier and a conductive metal oxide such as LSCO. A basic structure is given in TABLE 6.

TABLE 6

| LSCO |
| --- |
| $Ti_3Al$ |
| Poly-Si |
| Si |

There are at least two considerations to be addressed in that interface, the formation of an ohmic contact and the effect on the templating function, if any, of the LSCO or other metal oxide.

When an amorphous $Ti_3Al$ layer doped with Nb—Mo—V is deposited by pulsed laser ablation and then over deposited with LSCO, the interface shows ohmic behavior with a contact resistance of $15\Omega/\square$. The same structure formed by sputtering shows a contact cresistance of $30\Omega/\square$. With the sample with the amorphous intermetallic barrier, Rutherford back scattering shows no titanium oxidation, either with the LSCO electrode layer or with a Pt electrode layer in contact with the intermetallic. Hence, at least under our growth conditions, the amorphous barrier provides distinctly advantageous low-contact ohmic contacts.

Figure 3:
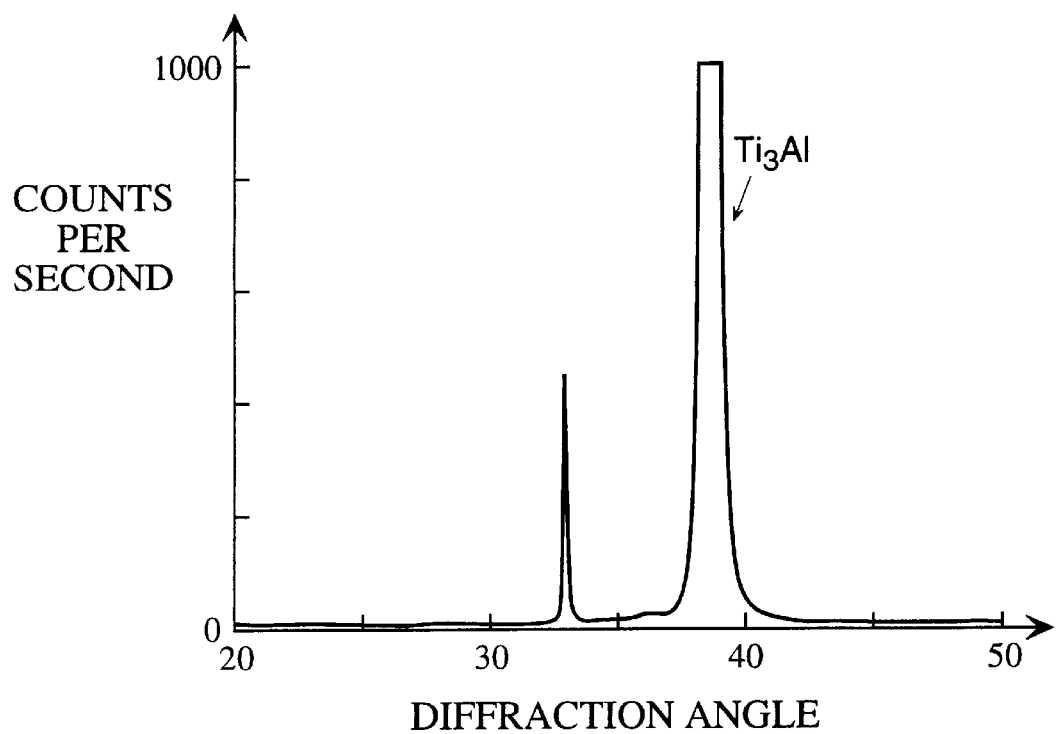
FIGS. 3 and 4 plot X-ray diffraction data with a crystalline intermetallic under layer.
Figure 4:
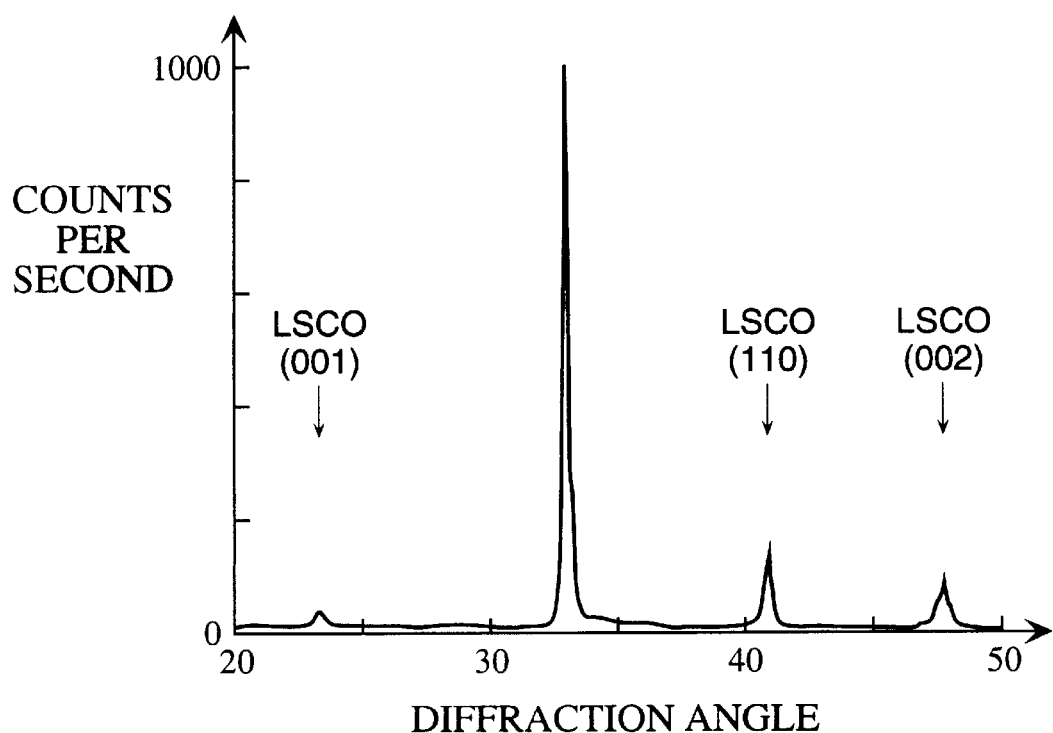

The crystallinity of the LSCO layer is controlled in part by the crystallinity of the underlying barrier layer. However, our results show that the LSCO crystallinity is increased by the amorphicity of the barrier layer. X-ray diffraction data are presented in FIG. 3 for a crystalline $Ti_3Al$ under layer prior to LSCO growth. A somewhat broad, very strong peak at 38.8° corresponds to the (002) reflection from crystalline $Ti_3Al$. A narrow, strong peak at 33° corresponds to the (002) reflection from silicon. The LSCO layer was then grown on the polycrystalline intermetallic. The X-ray diffraction data shown in FIG. 4 shows not only the strong Si peak, but also peaks at 23.3°, 41.0°, and 47.8°, corresponding respectively to the (001), (110), and (002) reflections from LSCO.

Figure 5:
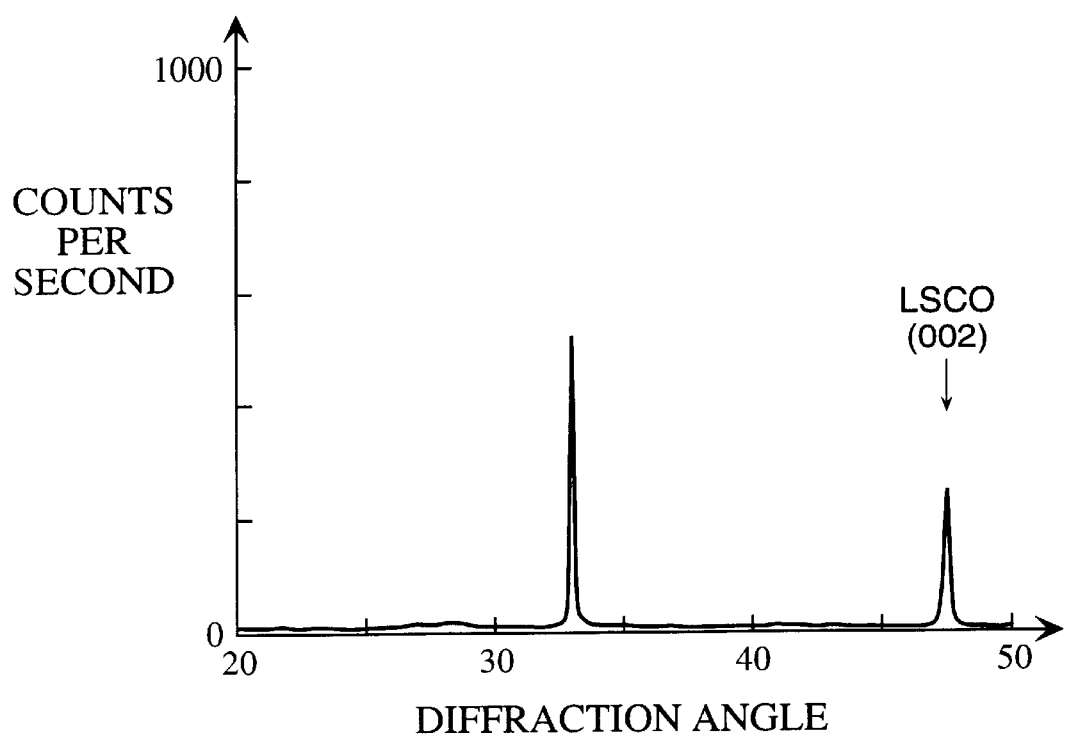
FIG. 5 plots X-ray diffraction data with an amorphous intermetallic under layer.

On the other hand, when the LSCO layer is grown on an amorphous intermetallic layer, it produces, as shown in FIG. 5, only the (002) reflection from LSCO. The (002) reflection corresponds to the desired c-axis orientation of the LSCO while the (110) reflection of the sample of FIG. 4 results from some a- or b-axis orientation of LSCO. The data of FIG. 4 shows that the LSCO layer grown on a polycrystalline layer is at least partially polycrystalline, following the orientations of the underlying polycrystallites. The data of FIG. 5 shows that the LSCO layer grown on an amorphous layer is predominantly c-axis oriented.

It is preferred that the ferroelectric layer in a memory cell such as illustrated in FIG. 2 have a c-axis orientation to maximize the ferroelectric effect. Such ferroelectric orientation is promoted by a c-axis oriented templating layer of LSCO. Based on the above results for the effect of the intermetallic's crystallinity upon the LSCO, it is now apparent that the underlying intermetallic layer is preferably amorphous to promote the c-axis crystallization of the LSCO templating layer and of the ferroelectric layer.

However, the amorphous barrier of the present invention is so effective at stopping the diffusion of oxygen that the columnar crystallinity of the ferroelectric and metal-oxide layers is no longer required to avoid oxygen damage. That is, the ferroelectric layer overlying an amorphous intermetallic barrier layer may be polycrystalline, and alternate compositions and growth conditions may be used which do not provide for crystallographic templating. It is still preferred that the electrodes sandwiching the ferroelectric layer be a conductive metal oxide, but the choice of metal oxide is much wider, as has been indicated in TABLE 4. Less exacting growth techniques are available for the metal oxide electrodes and ferroelectric layer, such as the sol-gel process.

Prototype ferroelectric cells were fabricated, as described in the previous patent documents on a structure given in TABLE 7 in which the PNZT has a composition of $PbNb_{0.04}Zr_{0.028}Ti_{0.68}O_3$.

TABLE 7

| Pt |
| --- |
| LSCO |
| PNZT |
| LSCO |
| Amorphous |
| $Ti_3Al$ |
| Poly-Si |
| Si |

The amorphous intermetallic layer is sufficiently conductive to serve as transversely conductive layer. Capacitors with 50 $\mu$m platinum dots were grown on the top LSCO electrode by a photolithographic liftoff process, followed by etching the uncovered top LSCO layer of the perovskite stack. The bottom contact could be made either capacitively through a large capacitor dot or directly to the underlying intermetallic layer.

Figure 6:
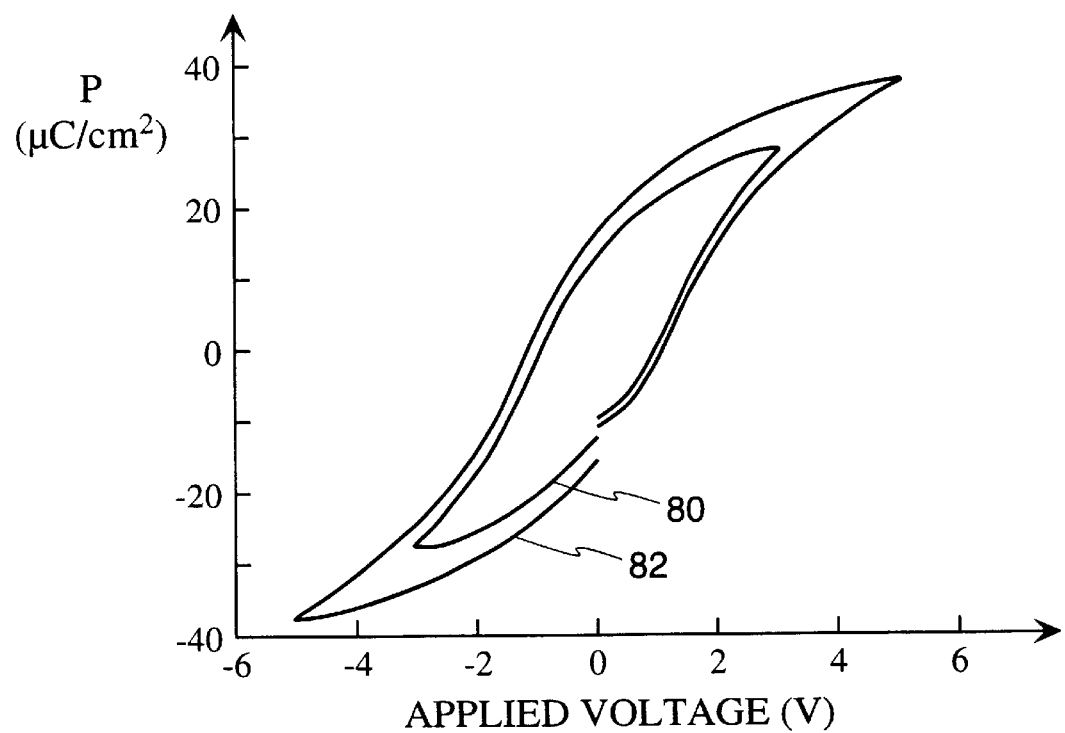
FIG. 6 plots hysteresis curves for a ferroelectric capacitor fabricated over an amorphous intermetallic barrier layer.

Hysteresis curves measured with the amorphous bottom $Ti_3Al$ barrier layer and direct electrical contact to it are presented in FIG. 6 for two different poling voltages, hysteresis curve 80 for 3V poling and hysteresis curve 82 for 5V poling. The polarization values with 5 V poling are impressively large, and the values with 3V poling are reduced but still large considering the reducing impressed voltages. Other data show that the polarization begins to saturate around 3 V and that they have a coercive voltage of about 0.8V at this poling voltage, good values in view of the desire to operate at reduced voltages. Nearly the same hysteresis curves are observed with capacitive coupling through a large capacitor to the underlying $Ti_3Al$ layer. The lack of difference indicates that there is no appreciable oxidation of the $Ti_3Al$.

Figure 7:
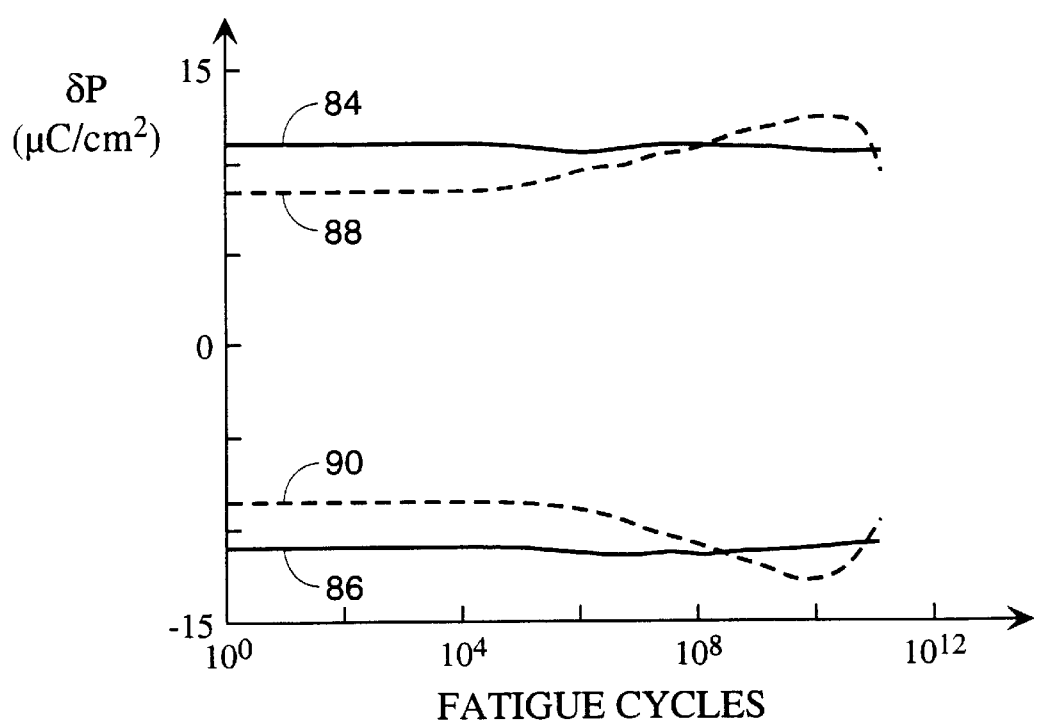
FIG. 7 are plots of the fatigue behavior of a ferroelectric capacitor of the invention.

Fatigue tests were run on sets of ferroelectric capacitors of the general type described above fabricated over either polycrystalline or amorphous $Ti_3Al$ intermetallic layer. The evolution of the remanent polarization $\delta P$ is shown in FIG. 7. The plots 84, 86 for an amorphous barrier begin at somewhat larger values and change only slightly over $10^{11}$ cycles of 5V poling. The plots 88, 90 for a crystalline barrier begin at lower values, increase somewhat after $10^7$ but then degrade significantly between $10^{10}$ and $10^{11}$ cycles.

Although the above discussion has been primarily directed to intermetallic barriers and intermetallics remain the preferred and tested materials, we believe that effective barriers can be formed of materials manifesting some similar qualities as the amorphous intermetallics.

The material for forming the amorphous barrier should have a high glass formation temperature. This is the temperature below which the material freezes into a glassy or amorphous state. The glass transition temperature can be controlled by choosing the constituent elements to have strong interactions between the different elements. For example, for a material formed of elements A and B, the A-B interaction should be much stronger than the A—A or B—B interactions. This difference in atomic interactions allows the intermetallic alloys to form with at least short range order.

A first class of such materials other than the intermetallics defined above are the metal-metalloid systems, where the metal is chosen from the group of palladium, iron, nickel, and cobalt (Pd, Fe, Ni, Co) and the metalloid is chosen from the group of carbon, phosphorous, and boron (C, P, B) and where the alloying percentage of the metalloid is between 15 and 25 wt %. Examples of such systems are Pd—Si, Co—P, Fe—P—C, Ni—P—B, and Fe—B. Two closely related alloy systems are combinations of titanium and carbon (Ti—C) and of titanium and boron (Ti—B)

A second class of such materials is a combination of an early transition metal and a late transition metal. The early transition metals include zirconium, yttrium, titanium, niobium, and tantalum (Zr, Y, Ti, Nb, Ta) and the late transition metals include copper and nickel (Cu, Ni). Examples of this class are: Zr—Cu with 30 to 65 wt % of Cu; Y—Cu with 30 to 40 wt % of Cu; Ti—Ni with 30 to 40 wt % of Ni; Nb—Ni and Ta—Ni with 40 to 65 wt % of Ni.

A third class includes two miscellaneous combinations of Mg—Zn with 25 to 35 wt % of Zn and (Ti, Zr)-Be with 20 to 60 wt % of Be.

Figure 8:
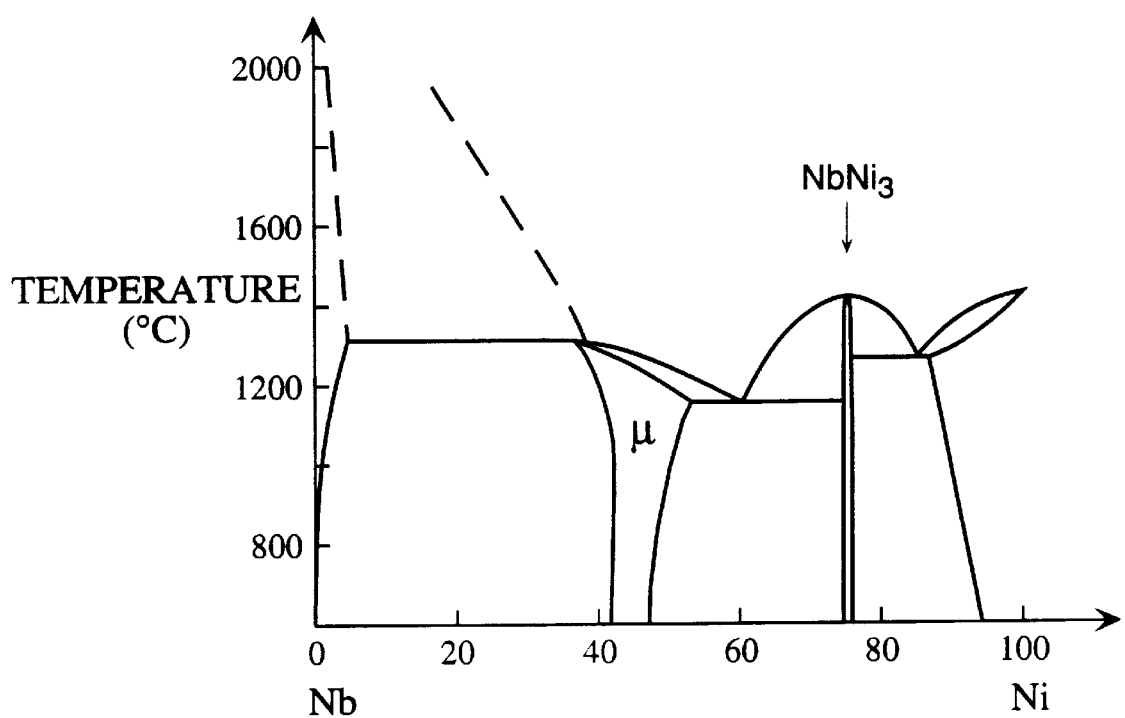
FIG. 8 is a phase diagram illustrating the characteristics of a glass-forming intermetallic.

Another desirable characteristic of material to be used for an amorphous barrier is derivable from the phase diagram of the alloy. An easily amorphized material may exhibit a steep eutectic in the phase diagram, as illustrated in the phase diagram of FIG. 8 for Nb—Ni, included in the class of early and late transition metals. Here the eutectic occurs at 60 atomic % Ni. The glass forming region extends approximately from 40 to 65 atomic % Ni under the proper processing conditions, and the lower limit may extend down to 30% for other members of the class.

Another requirement for the amorphous barrier material is that it must remain amorphous through the deposition and crystallization of the ferroelectric stack. For PZT-based ferroelectrics, this temperature is preferably in the range of 500 to 650° C. The material of the amorphous barrier must have a crystallization temperature in excess of the ferroelectric crystallization temperature. These three classes of metals mentioned above are advantageous for use as a barrier layer in a ferroelectric cell because they are electrically conductive and remain in the amorphous stage at the typical growt h temperatures of the ferroelectric stack.

Although the simpler embodiments of the crystallographically oriented ferroelectric include a lower electrode layer of a conductive metal oxide which further serves as a templating layer, it is understood that a separate templating layer may be interposed between the barrier layer and the lower electrode. It is also understood that additional layers may be interposed between the barrier layer and the underlying silicon.

The preferred embodiment of the integrated memory illustrated in FIG. 1 allows for high-density memories since the ferroelectric stack overlies the silicon transistor. Another memory structure, called the strap configuration, places the transistor and ferroelectric stack at different horizontal positions; however, this configuration provides only a low-density memory. Nonetheless, many aspects of the invention are applicable to ferroelectric cell structures other than that of FIG. 1.

Although the invention was developed to improve the reliability of ferroelectric non-volatile memories, the amorphous barrier of the invention can be advantageously applied to other devices having an oxide or perovskite active layer grown on a conductive layer. Ramesh has described several of these devices in U.S. Pat. No. 5,270,298. One simple two-electrode example is a high-capacity capacitor not relying on a memory effect, for example, a dynamic random access memory (DRAM), even one formed on the walls of a trench. In this case, the capacitor gap is filled with a perovskite having a high dielectric constant. Such a material is barium strontium titanate (BST), which is considered as a ferroelectric even though it does not have a spontaneous polarization. Also, the perovskite element can be integrated with other types of semiconductors, such as the compound semiconductors, including GaAs.

Although in the examples the intermetallic alloy was sputtered and the ferroelectric stack was deposited either by pulsed laser deposition (PLD) or sol-gel, the materials can be grown by other methods, including PLD, RF or DC sputtering (physical vapor deposition, PVD), chemical vapor deposition (CVD) and, particularly in the case of polycrystalline ferroelectrics, by more conventional methods such as sol-gel.

The invention thereby provides for increased performance and reliability with only a small change from the now known intermetallic barrier. Furthermore, the effectiveness of an amorphous barrier allows other materials to be used as the barrier material, and the amorphous barrier greatly increases the reliability of conventional polycrystalline ferroelectric cells.

What is claimed is:

1. A ferroelectric element integrated with silicon, comprising:
   a substrate including a silicon surface portion;
   an electrically conductive amorphous barrier layer deposited over said silicon surface portion;
   a lower conductive metal oxide layer formed over said barrier layer; and
   a ferroelectric layer formed over said metal oxide layer.

2. The ferroelectric element of claim 1, further comprising a titanium nitride layer interposed between said silicon surface portion said amorphous barrier layer.

3. The ferroelectric element of claim 1, wherein said amorphous barrier layer comprises an intermetallic alloy.

4. The ferroelectric element of claim 3, wherein said intermetallic alloy consists essentially of one of AB, $A_2B$, $A_3B$, $AB_2$, and $AB_3$, wherein A and B are metallic elements.

5. The ferroelectric element of claim 4, wherein said intermetallic alloy does not deviate from stoichiometry from one of said AB, $A_2B$, $A_3B$, $AB_2$, and $AB_3$ by more than 5 atomic percent.

6. The ferroelectric element as recited in claim 4, wherein A is selected from the group consisting of Fe, Cr, Co, Ni, Mn, Mo, and Nb and B is selected from the group consisting of Al, Ti, Cr, Si, Ru, Re, and W.

7. The ferroelectric element of claim 3, wherein said intermetallic alloy consists essentially of one of TiB, $Ti_2B$, $Ti_3B$, $TiB_2$, and $TiB_3$, wherein B is selected from the group consisting of Al, Cr, Si, Ru, Re, and W.

8. The ferroelectric element as recited in claim 7, wherein B is Al.

9. The ferroelectric element of claim 1, further comprising an upper conductive metal oxide layer formed over said ferroelectric layer.

10. The ferroelectric element of claim 9, wherein said amorphous barrier layer comprises an intermetallic alloy and further comprising an upper barrier layer comprising an intermetallic alloy formed over said upper conductive metal oxide layer.

11. The ferroelectric element of claim 1, wherein said amorphous barrier layer has an average crystalline order extending over no more than five lattice constants.

12. A perovskite element integrated with a semiconductor, comprising:
   a substrate including a semiconducting surface portion;
   an electrically conductive amorphous barrier layer deposited over said semiconducting surface portion;
   a lower conductive metal oxide layer formed over said barrier layer; and
   a perovskite layer formed over said metal oxide layer.

13. The perovskite element of claim 12, wherein said amorphous barrier layer has an average crystalline order extending over no more than five lattice constants.

14. The perovskite element of claim 12, wherein said amorphous barrier layer comprises an intermetallic alloy.

15. The perovskite element of claim 14, wherein said intermetallic alloy comprises one of $AB$, $AB_2$, $A_2B$, $AB_3$, and $A_3B$, wherein A is selected from the family consisting of Fe, Cr, Co, Ni, Mn, and Mo, and B is selected from the family consisting of Al, Ti, Cr, Si, Ru, Re, and W.

16. The perovskite element of claim 14, wherein said intermetallic alloy comprises $AA'$, $A_2A'$, and $A_3A'$, wherein A and A' are different and each is selected from the family consisting of Fe, Cr, Co, Ni, Mn, and Mo.

17. The perovskite element of claim 14, wherein said intermetallic alloy comprises $BB'$, $B_2B'$, and $B_3B'$, wherein B and B' are Brent and each is selected from the family consisting of Al, Ti, Cr, Si, Ru, Re, and W.

18. The perovskite element of claim 14, wherein said intermetallic alloy comprises one of $TiB$, $TiB_2$, $Ti_2B$, $TiB_3$, and $Ti_3B$ whe is selected from the family consisting of Al, Cr, Si, Ru, Re, and W.

19. The perovskite element of claim 18, wherein B is Al.

20. The perovskite element of claim 12, wherein said amorphous barrier layer comprises a metal and a metalloid, wherein saimetal is selected from the group consisting of palladium, iron, nickel, and cobalt and said metalloid is selected from the group consisting of carbon, phosphorus, and boron, and wherein an alloying percentage of the metalloid in the barrier layer is between 15 and 25 wt %.

21. The perovskite element of claim 12, wherein said amorphous barrier layer comprises an early transition metal and Ma transition metal, wherein said early transition metal is selected from the group consisting of Y, Zr, Nb, Ta, and Ti and said late transition metal is selected from the group consisting of Cu and Ni and wherein an alloying percentage of the late transition metal is between 30 and 65 atomic %.

22. The perovskite element of claim 12, wherein said amorphous barrier layer comprises magnesium and 25 to 35 wt % of zinc.

23. The perovskite element of claim 12, wherein said amorphous barrier layer comprises titanium, zirconium, and 20 to 60 wt . % of beryllium.

24. A ferroelectric capacitor, comprising:
   a substrate;
   an amorphous barrier layer formed over said substrate;
   a lower electrode layer formed over said barrier layer;
   a ferroelectric layerformed over said lower electrode layer; and
   an upper electrode layer formed over said ferroelectric layer.

25. The ferroelectric capacitor of claim 24, wherein said amorphous barrier layer has an average crystalline order extending over no more than five lattice constants.

26. The ferroelectric capacitor of claim 24, wherein said upper and lower electrode layers comprise respective conductive metal oxides.

27. The ferroelectric capacitor of claim 24, wherein both of said metal oxides comprise a strontium oxide selected from the group consisting of lanthanum strontium cobaltite and strontium ruthenate.

28. The ferroelectric capacitor of claim 24, wherein said ferroelectric layer comprises barium strontium titanate.

29. A perovskite capacitor cell integrated on silicon, comprising:
   a silicon substrate having formed therein active silicon devices;
   a dielectric layer formed over said silicon wafer;
   a conductive plug formed through said dielectric layer and electrically contacting said silicon substrate;
   an amorphous barrier layer formed over said plug; and
   a perovskite stack formed over said amorphous barrier layer and including
      a metal-oxide lower electrode,
      a ferroelectric layer, and
      a metal-oxide upper layer.

30. The capacitor cell of claim 29, wherein said amorphous barrier layer comprises an amorphous intermetallic alloy.

31. The capacitor cell of claim 30, further comprising a crystalline upper intermetallic alloy layer formed over said upper electrode layer.

32. The capacitor cell of claim 29, wherein said plug comprises polysilicon.

33. The capacitor cell of claim 32, further comprising a polysilicon layer formed over portions of said dielectric layer and over said polysilicon plug.

34. The capacitor cell of claim 29, wherein said plug comprises tungsten.

35. The capacitor cell of claim 29, wherein said ferroelectric layer comprises barium strontium titanate.

* * * * *

UNITED STATES PATENT AND TRADEMARK OFFICE
CERTIFICATE OF CORRECTION

PATENT NO. : 6,194,754 B1
DATED : February 27, 2001
INVENTOR(S) : Sanjeev Aggarwal, Ramamoorthy Ramesh It is certified that error appears in the above-identified patent and that said Letters Patent is hereby corrected as shown below:

Column 13,
Line 29, after "are" change "Brent" to -- different --
Line 33, after "Ti3B" change "whe" to -- where B --
Line 38, after "wherein" change "saimetal" to -- said metal --
Line 45, after "and" change "Ma" to -- a late --

Column 14,
Line 6, after "ferroelectric" change "layerformed" to -- layer formed --

Signed and Sealed this

Sixth Day of November, 2001

Attest:

NICHOLAS P. GODICI
Attesting Officer
Acting Director of the United States Patent and Trademark Office